(12) United States Patent
Kanaya

(10) Patent No.: US 7,363,020 B2
(45) Date of Patent: Apr. 22, 2008

(54) DIODE MIXER

(75) Inventor: Koh Kanaya, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 482 days.

(21) Appl. No.: 11/195,827

(22) Filed: Aug. 3, 2005

(65) Prior Publication Data

US 2006/0040637 A1    Feb. 23, 2006

(30) Foreign Application Priority Data

Aug. 20, 2004  (JP) ............................. 2004-240458

(51) Int. Cl.
  *H04B 1/26* (2006.01)
(52) U.S. Cl. ...................... 455/323; 455/330
(58) Field of Classification Search ............. None
  See application file for complete search history.

(56) References Cited

U.S. PATENT DOCUMENTS 5,606,738 A * 2/1997 Onodera et al. ............ 455/333
5,678,226 A * 10/1997 Li et al. ..................... 455/333
6,163,689 A * 12/2000 Lee ............................ 455/323

FOREIGN PATENT DOCUMENTS

| GB | 2033181 A | 5/1980 |
|---|---|---|
| JP | 55-042412 | 3/1980 |
| JP | 61-061524 | 3/1986 |
| JP | 02-108301 | 4/1990 |
| JP | 04-078203 | 3/1992 |
| JP | 04078203 | 12/1992 |
| JP | 2004-140438 | 5/2004 |
| WO | WO 96/32782 | 10/1996 |
| WO | WO 97/08821 | 3/1997 |

OTHER PUBLICATIONS

Bernkopf et al., "A Monolithic $K_A$-Band Sub-Harmonically Pumped Frequency Converter", IEEE Microwave and Millimeter-Wave Monolithic Circuits Symposium, pp. 43-46, (1991).

* cited by examiner

*Primary Examiner*—Thanh Cong Le
(74) *Attorney, Agent, or Firm*—Leydig, Voit & Mayer, Ltd.

(57) ABSTRACT

A diode mixer comprises a mixer diode section which has a first circuit including an inductor and a capacitor connected in series and a diode connected in parallel with the first circuit and which includes a first connecting portion to which one end of the first circuit and the anode of the diode are connected, and a second connecting portion to which the other end of the first inductor circuit and the cathode of the diode are connected; an LO signal port connected to the first connecting portion via a first branching circuit and receiving an LO signal; an IF signal port connected to the mixer diode section via a second branching circuit; and an RF signal port connected to the mixer diode section through a third branching circuit. The inductor and the capacitive component of the diode constitute a resonant circuit.

12 Claims, 7 Drawing Sheets

DIODE MIXER

BACKGROUND OF THE INVENTION

1. Field of the Invention

The present invention relates to a diode mixer, and particularly to a diode mixer used in electronic equipment and microwave-band and millimeter-wave band communication apparatuses for mobile communications and wireless communications.

2. Description of the related Art

There has recently been an increasingly demand for small-sized and high-power apparatuses as communication apparatuses used in a microwave band and a millimeter wave band. With the demand thereof, there has been a demand for a mixer high in frequency conversion efficiency. However, a mixer good in noise characteristic is required simultaneously.

For example, a communication laser device causes the disadvantages that when a mixer is unsatisfactory in noise characteristic, an S/N ratio is reduced and the maximum attainable distance of signal light is decreased, and the cost of a system increases in order to highly maintain the reliability of the system.

In such a system that a millimeter wave band is directly down-converted into a low frequency band, e.g., 100 kHz or the like at which low frequency noise or 1/f noise greatly influences a noise characteristic as in the case of a vehicle-mounted radar or the like, a homodyne system in which an IF frequency of an intermediate frequency signal (hereinafter called "IF signal") is low, is used at its mixer.

In this homodyne type mixer, the use of a pn diode low in low frequency noise is effective in obtaining a satisfactory noise characteristic.

As a known technique of a mixer, there has been known a known example that has disclosed an even number harmonic mixer using an antiparallel diode pair (refer to, for example, Japanese Patent Publication No. 2795972, the 2nd to 3rd sections and FIG. 6, and the 4th to 5th sections and FIG. 1).

As a known technique of an electronic high frequency switch, there has been disclosed an example wherein a coil is parallel-connected to a diode, and the resonance frequency of a resonant circuit constituted of a reverse bias capacitance of the diode and the coil is set to be close to the frequency of a used high frequency signal to increase impedance at near the used frequency, thereby improving isolation (refer to, for example, Japanese Patent Laid-Open No. Sho 55(1980)-42412, the lower left-hand section in the 54th page and FIG. 6).

As a known technique of a diode switch circuit, there has been disclosed an example wherein a reactance circuit including a series connection circuit configured of an inductance and a capacitor is connected across a diode in parallel with the diode, whereby a diode switch circuit superior in high frequency characteristic is configured (refer to, for example, Japanese Patent Laid-Open No. Sho 61(1986)-61524, the lower left-hand section of the 108th page and FIG. 1).

As a known technique of a λ/4 type switch circuit, there has been disclosed an example wherein a circuit in which an inductor having an inductance value that produce parallel resonance with the capacitance of a diode and a DC-cutting capacitor are connected in series, is connected in parallel with the diode(refer to, for example, Japanese Patent Laid-Open No. Hei 2(1990)-108301, the lower right-hand section of the 2nd page and FIG. 1).

As a known example of a frequency converting circuit, there has been disclosed an example wherein coils are series-connected to their corresponding diodes that constitute an antiparallel diode pair of an even number harmonic mixer to compensate for junction capacitances of the diodes, thereby reducing a loss at frequency conversion (refer to, for example, Japanese Patent Laid-Open No. 2004-140438 and FIG. 1).

However, the mixer using the pn diode was reduced in frequency conversion efficiency in some instances due to the existence of a diffusion capacitance in the diode.

An equivalent circuit of the diode is represented as one in which a variable resistive component and a variable capacitive component are connected in parallel.

And the capacitance of the pn diode is given as expressed in the following equation (1):

$$Cj = (Cjo/(1-(V/Vf))^M) + ((q\tau Is)/(nkT))\exp(qV/(nkT)) \quad (1)$$

where Cjo indicates a capacitive component at 0V, Vf indicates a built-in voltage, M indicates a tilt coefficient, q indicates an elementary charge, τ indicates transition time, Is indicates a saturation current, n indicates an ideal coefficient, and k indicates the Boltzmann constant, respectively.

The first term on the right side of the equation (1) indicates a junction capacitance, and the second term thereof indicates a diffusion capacitance.

A diffusion capacitance that changes in the form of an exponential function with an anode voltage exists in the capacitive component of the diode in addition to the junction capacitance. Thus, a region that increases exponentially with an increase in anode voltage exists in the capacitive component of the diode.

When power of a local oscillation signal (hereinafter called "LO signal") increases in the diode mixer using the pn diode, that is, when the amplitude of the anode voltage increases, the capacitive component of the diode increases exponentially in the vicinity of its built-in voltage (or on voltage or threshold voltage) at forward biasing in accordance with the second term of the equation (1).

On the other hand, on the mixing, nonlinearity of a current-voltage characteristic in the vicinity of the built-in voltage is important. When the anode voltage amplitude of the LO signal reaches a region in which a current in the vicinity of the built-in voltage changes most abruptly, conversion gain becomes the largest and decreases sharply at its anode voltage amplitude slightly lower than this region.

Therefore, a problem arises in that even though attempts are made to increase the power of the LO signal, increase the anode amplitude voltage of the LO signal and raise conversion gain for frequency conversion, the capacitive component of the diode increases exponentially and the power of the LO signal is not effectively inputted to the variable resistive component of the diode, which contributes to the frequency conversion at a mixer circuit, so that satisfactory frequency conversion efficiency is not obtained.

SUMMARY OF THE INVENTION

The present invention has been made to solve the above problem, and it is a first object to provide a diode mixer high in frequency conversion efficiency and good in noise characteristic in a simple configuration.

According to one aspect of the invention, there is provided a diode mixer comprising: a semiconductor section having a first circuit element unit including an inductor and a capacitor connected in series, a first diode connected in parallel with the first circuit element unit, a first connecting portion to which one end of the first circuit element unit and an anode of the first diode are connected, and a second connecting portion to which the other end of the first circuit element unit and a cathode of the first diode are connected; a first signal input/output terminal connected to the first connecting portion of the semiconductor section and inputted with a first signal; a first branching circuit disposed between the first signal input/output terminal and the first connecting portion of the semiconductor section; a second signal input/output terminal connected to the semiconductor section through a second branching circuit; and a third signal input/output terminal connected to the semiconductor section through a third branching circuit; wherein the inductor and a capacitive component of the first diode constitute a resonant circuit with respect to the first signal.

Accordingly, in the diode mixer according to the present invention, the first circuit element unit is connected in parallel with the first diode in the semiconductor section. The first circuit element unit has a circuit in which the capacitor and the inductor are connected in series with each other.

And the amplitude of the forward anode voltage of the first signal becomes a value near the built-in voltage of the first diode. Correspondingly, the variable capacitive component of the first diode has a large capacitance value. The inductance value of the inductor is set in such a manner that the variable capacitive component having the large capacitance value and the inductor constitute a parallel resonant circuit with respect to the frequency of the first signal.

To this end, when the first signal whose power is increased to such an extent that the forward anode voltage amplitude of the first signal reaches near the built-in voltage of the first diode, is applied to the semiconductor section, parallel resonance occurs by means of the variable capacitive component and the inductor, so that leakage of input power with an increase in the capacitance of the variable capacitive component, which increases with an increase in the anode voltage, is suppressed, and the first signal is effectively inputted to the variable resistive component of the first diode that contributes to frequency conversion at the diode mixer, thereby making it possible to improve frequency conversion gain of the diode mixer.

Thus, the simple configuration that the first circuit element unit having such a circuit that the capacitor and the inductor are connected in series, is connected in parallel with the first diode, makes it possible to constitute a diode mixer satisfactory in noise characteristic, large in conversion gain for frequency conversion and high in frequency conversion efficiency.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

The following description will be made of a diode mixer using a pn diode in general. However, the present invention is not necessarily limited to the pn diode. A Schottky diode may be used.

Not only using the mere pn diode, a Schottky diode that connects the drain and source of an FET fabricable on the same substrate as a semiconductor amplifier, a semiconductor oscillator or the like may be used. Alternatively, a pn diode connected between the base and collector of an HBT may be used, or a pn diode connected between the base and emitter thereof may be used.

Although the following embodiments explain diode mixers low in the frequency of an IF signal, each of which is used in a homodyne system, the present invention is not necessarily limited to such homodyne type diode mixers.

First Embodiment

Figure 1:
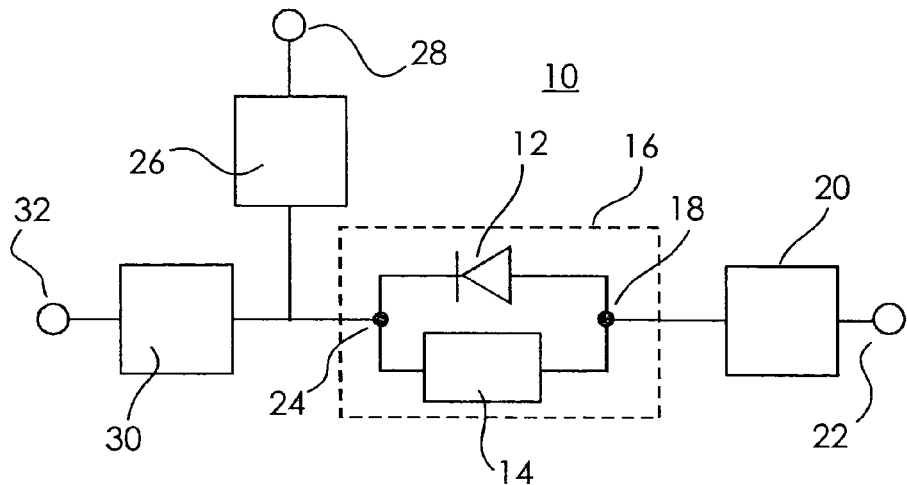
FIG. 1 is a block diagram of a diode mixer according to a first embodiment of the present invention.

FIG. 1 is a block diagram of a diode mixer according to a first embodiment of the present invention.

Incidentally, the same reference numerals indicate the same or corresponding ones in respective figures.

In FIG. 1, the diode mixer 10 is of a single-ended diode mixer and comprises a mixer diode section 16 serving as a semiconductor section, which comprises a diode 12 serving as a first diode and a first inductor circuit 14 serving as a first circuit element unit including an inductor and a capacitor parallel-connected to the diode 12 and connected in series with each other, an LO signal port 22 serving as a first signal input/output terminal, which is connected via a first branching circuit 20 to a first connecting portion 18 to which the anode of the diode 12 and the first inductor circuit 14 in the mixer diode section 16 are connected, an IF signal port 28 serving as a second signal input/output terminal, which is connected via a second branching circuit 26 to a second connecting portion 24 to which the cathode of the diode 12 and the first inductor circuit 14 in the mixer diode section 16 are connected, and a high frequency signal (hereinafter called "RF signal") port 32 serving as a third signal input/output terminal, which is connected to the second connecting portion 24 via a third branching circuit 30.

Although there is shown an example in which the second branching circuit 26 and the IF signal port 28 are connected to the second connecting portion 24 in the diode mixer 10, the second branching circuit 26 and the IF signal port 28 may be connected to the first connecting port 18 in place of the second connecting portion 24.

Figure 2:
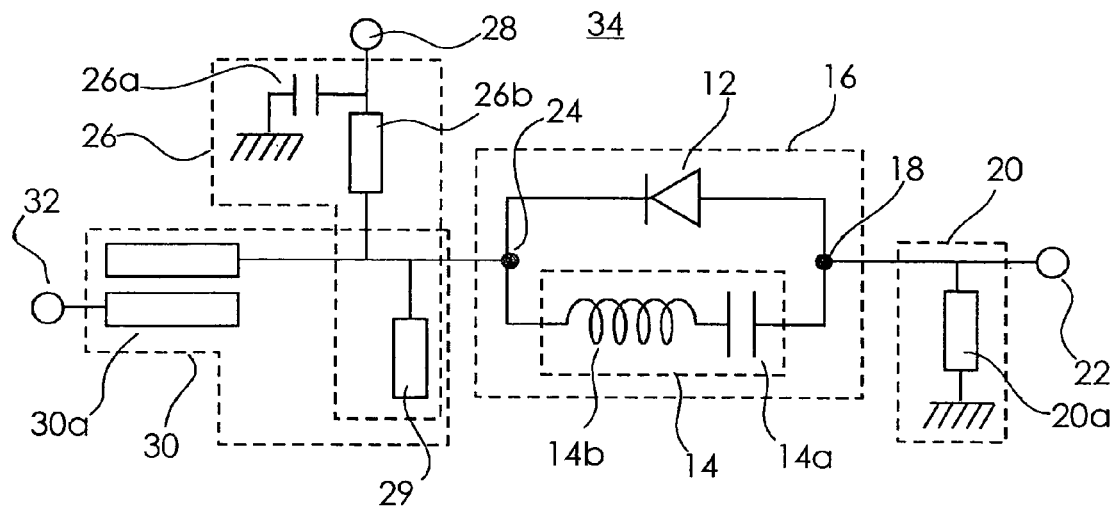
FIG. 2 is a circuit diagram of a diode mixer according to one embodiment of the present invention.

FIG. 2 is a circuit diagram of a diode mixer according to one embodiment of the present invention.

The diode mixer 34 shown in FIG. 2 is one example of the diode mixer 10. It is of, for example, a downconverter single-ended mixer used as a receiving mixer of a 76 GHz-band vehicle-mounted millimeter wave radar used to detect obstacles or the like.

In the diode mixer 34, an LO signal is inputted from an LO signal port 22, an RF signal is inputted from an RF signal port 32, and an IF signal having a low frequency, e.g., 100 kHz is outputted from an IF signal port 28.

A diode 12 of a mixer diode section 16 is a pn diode.

A first inductor circuit 14 includes a DC cutoff capacitor 14a and an inductor 14b which produces resonance in parallel with a variable capacitive component of the diode 12 at the frequency of the LO signal to thereby suppress leakage of input power with an increase in the capacitive component.

The inductance value of the inductor 14b is set in such a manner that the amplitude of a voltage applied to the anode of the diode 12, based on the LO signal becomes a value near a built-in voltage of the diode 12 and correspondingly the variable capacitive component of the diode 12 constitutes a parallel resonant circuit together with a capacitance having a large value.

The first branching circuit 20 comprises a short stub 20a having an electric length of $\lambda L0/4$ when the wavelength of the LO signal is set to $\lambda L0$.

The second branching circuit 26 comprises an open stub 29 having an electric length of $\lambda L0/4$, which is connected to the second connecting portion 24, and a short stub 26b which is connected to the second connecting portion 24 in like manner and has an electric length of $\lambda RF/4$ when the wavelength of the RF signal is set to $\lambda RF$, and which is grounded via a DC cutoff capacitor 26a.

The third branching circuit 30 comprises an open stub 29 shared with the second branching circuit 26, and a filter 30a.

The short stub 20a, i.e., the first branching circuit 20 functions so as to cut off the RF signal and the IF signal with respect to the LO signal port 22 and cause the LO signal to pass through the LO signal port 22.

The open stub 29 has the function of causing the RF signal and the IF signal to pass therethrough and cutting off the LO signal. The short stub 26b has the function of cutting off the RF signal with respect to the IF signal port 28. Thus, the second branching circuit 26 cuts off the RF signal and the LO signal with respect to the IF signal port 28 and allows the IF signal to pass therethrough.

Since the filter 30a functions so as to cut off the IF signal and allow the RF signal to pass therethrough, the third branching circuit 30 cuts off the IF signal and the LO signal with respect to the RF signal port 32 and causes the RF signal to pass therethrough by a combination of the filter 30a and the open stub 29.

The operation of the diode mixer 34 will next be explained.

Figure 3:
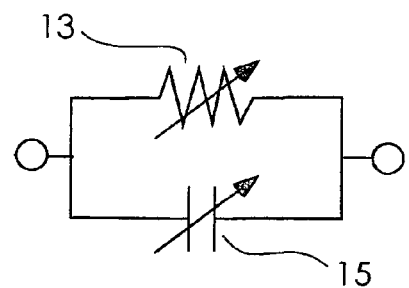
FIG. 3 is an equivalent circuit diagram of the diode employed in the diode mixer according to one embodiment of the present invention.

FIG. 3 is an equivalent circuit diagram of the diode employed in the diode mixer according to one embodiment of the present invention.

The diode 12 of the mixer diode section 16 employed in the diode mixer 34 is represented as one in which a variable resistive component 13 and a variable capacitive component 15 are connected in parallel as shown in FIG. 3.

Figure 4:
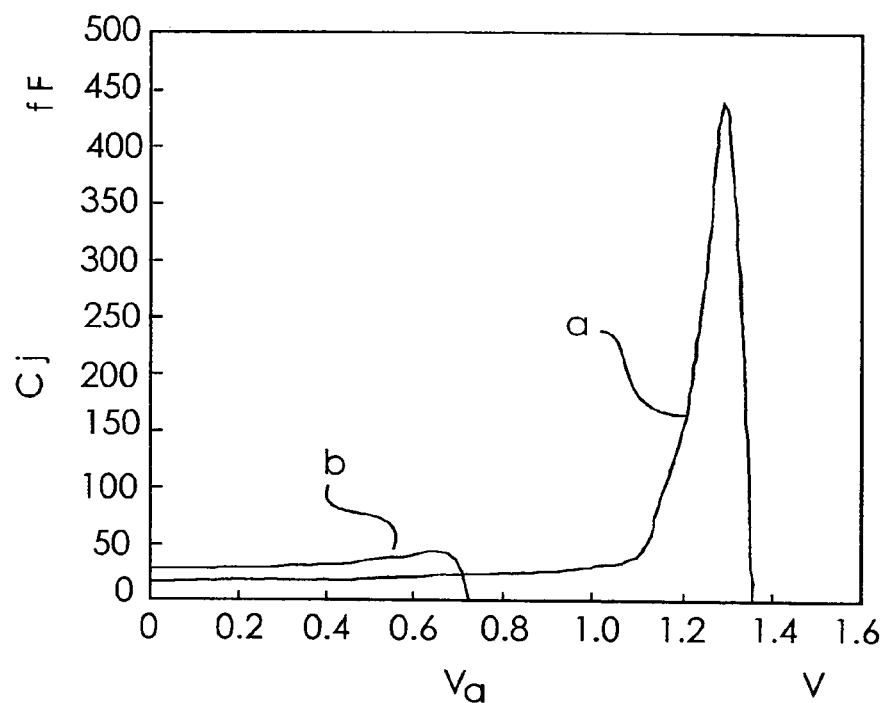
FIG. 4 is a graph showing changes in capacitance value of a variable capacitive component of the diode with respect to forward anode voltages of the diode employed in the diode mixer according to one embodiment of the present invention.

FIG. 4 is a graph showing changes in capacitance value of a variable capacitive component of the diode with respect to forward anode voltages of the diode employed in the diode mixer according to one embodiment of the present invention. In FIG. 4, a curve a indicates an actually measured value about a pn diode, whereas a curve b indicates an actually measured value about a Schottky diode.

An LO signal is inputted from the LO signal port 22 to the mixer diode section 16 of the diode mixer 34 via the first branching circuit 20, and an RF signal is inputted from the RF signal port 32 thereto via the third branching circuit 30.

When the LO signal and the RF signal are signals lying within a millimeter-wave band and are down-converted to an IF signal having a low frequency such as 100 kHz, a noise characteristic greatly depends upon low frequency noise (or 1/f noise) of a diode to be used. This low-frequency noise characteristic shows that the pn diode is excellent in characteristic. Since the pn diode is used as the diode 12 to this end, the diode mixer 34 results in a diode mixer having a satisfactory noise characteristic.

When the LO signal and the RF signal are mixed together at the diode mixer 34, power of the LO signal is increased to such a degree that the forward anode voltage of the diode 12 reaches a built-in voltage (Va=near 1.2V) of the diode 12.

The LO signal and the RF signal are mixed according to the nonlinearity of a current-voltage characteristic in the vicinity of the built-in voltage held by the diode 12 to which the forward anode voltage is applied. A signal having a desired frequency, which is taken from the mixed wave, is outputted from the IF signal port 28 through the second branching circuit 26 as an IF signal.

The voltage amplitude of the LO signal becomes near (Va=near 1.2V) the built-in voltage of the diode 12, and conversion gain for frequency conversion is extremely large in a region in which current changes most abruptly with respect to the anode voltage of the diode 12. Incidentally, when the voltage amplitude of the LO signal is not greater than 1.1V, the conversion gain becomes extremely small.

As shown in FIG. 4, however, the capacitance Cj of the variable capacitive component 15 of the diode 12 ranges from approximately 20 to 30 fF in a region of Va=1.1V or less. On the other hand, the capacitance Cj steeply changes from 30 fF up to 450 fF in a region from beyond or over Va=1.1V to Va=approximately 1.1 to 1.3V containing the built-in voltage.

Therefore, in the case of the conventional diode mixer, the LO signal becomes hard to be inputted to the variable resistive component 13 with an increase in the capacitance Cj of the-variable capacitive component 15 and hence a frequency conversion characteristic is degraded.

In the diode mixer 34, however, the first inductor circuit 14 is connected in parallel with the diode 12 in the mixer diode section 16. The first inductor circuit 14 has a circuit in which the capacitor 14a and the inductor 14b are connected in series with each other.

And the amplitude of the forward anode voltage of the LO signal becomes a value near the built-in voltage of the diode 12. Correspondingly, the variable capacitive component 15 of the diode 12 has a large capacitance value. The inductance value of the inductor 14b is set in such a manner that the variable capacitive component 15 having the large capacitance value and the inductor 14b constitute a parallel resonant circuit with respect to the frequency of the LO signal.

To this end, when the LO signal whose power is increased to such an extent that the forward anode voltage amplitude of the LO signal reaches near the built-in voltage of the diode 12, is applied to the mixer diode section 16, parallel resonance occurs by means of the variable capacitive component 15 and the inductor 14b, so that leakage of input power with an increase in the capacitance of the variable capacitive component 15, which increases with an increase in the anode voltage, is suppressed, and the LO signal is effectively inputted to the variable resistive component 13 of the diode 12 that contributes to frequency conversion at the diode mixer 34, thereby making it possible to improve frequency conversion gain of the diode mixer 34.

Thus, owing to the simple configuration that the first inductor circuit 14 having the circuit in which the capacitor 14a and the inductor 14b are connected in series, is connected in parallel with the diode 12 at the diode mixer 34, a diode mixer can be configured which is satisfactory in noise characteristic, large in conversion gain for frequency conversion and high in frequency conversion efficiency.

Incidentally, the LO signal lying within the millimeter-wave band especially is considered to be reduced in conversion gain when an inductor is inserted in series with the diode 12.

Figure 5:
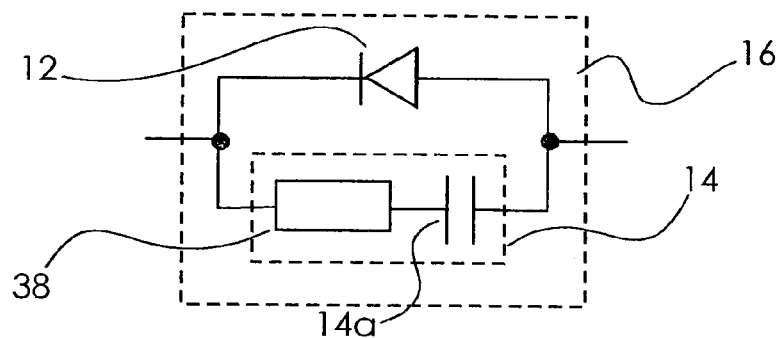
FIG. 5 is a typical diagram of a mixer diode section employed in the diode mixer according to one embodiment of the present invention.

FIG. 5 is a typical diagram of a mixer diode section employed in the diode mixer according to one embodiment of the present invention.

In FIG. 5, a microstrip line 38 is used as the inductor 14b. The microstrip line 38 may be configured of a coplanar line or other line. In this case, a circuit area can be reduced.

Figure 6:
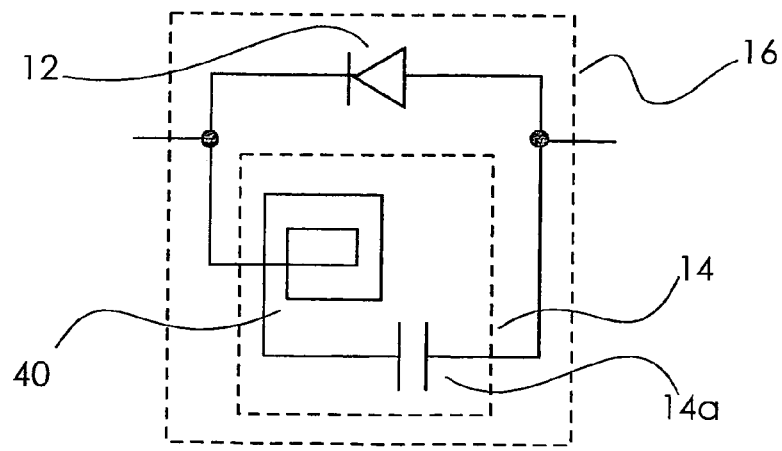
FIG. 6 is a typical diagram of a mixer diode section employed in the diode mixer according to one embodiment of the present invention.

FIG. 6 is a typical diagram of a mixer diode section employed in the diode mixer according to one embodiment of the present invention.

In FIG. 6, a spiral inductor 40 is used as the inductor 14b. In this case, when a variable capacitive component 15 of a diode 12, and the inductor 14b constitute a parallel resonant circuit with respect to the frequency of the LO signal, a circuit area can be reduced even where a high inductance value is needed.

Figure 7:
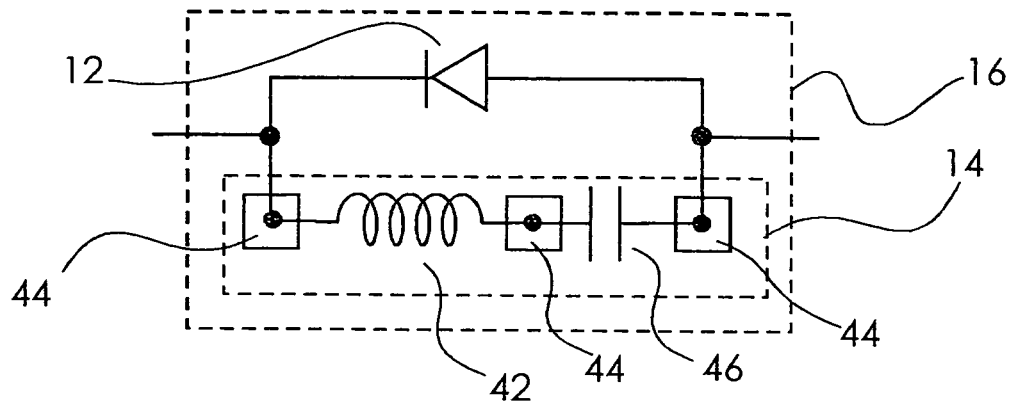
FIG. 7 is a typical diagram of a mixer diode section employed in the diode mixer according to one embodiment of the present invention.

FIG. 7 is a typical diagram of a mixer diode section employed in the diode mixer according to one embodiment of the present invention.

FIG. 7 shows a case in which a bonding wire 42 is used as the inductor 14b. In this case, the bonding wire 42 and a chip capacitor 46 used as the capacitor 14a are connected in series with each other by using a bonding pad 44 disposed in advance. Thus, the inductance and capacitance can be selected upon their assembling. This can adapt more delicately to the case where they constitute a parallel resonant circuit together with the variable capacitive component 15 of the diode 12.

Figure 8:
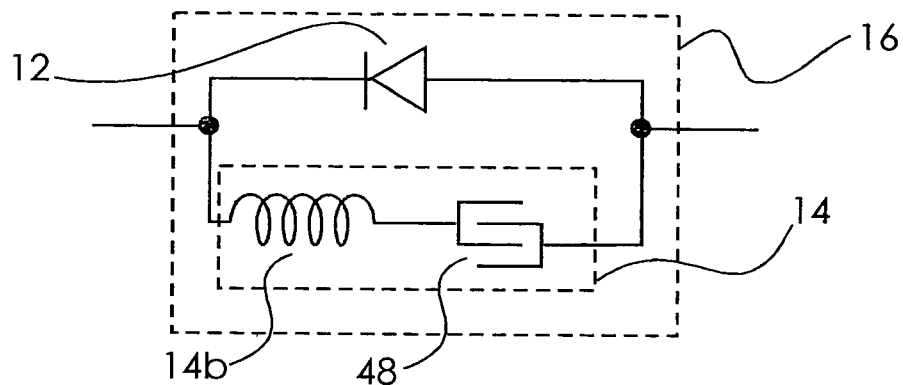
FIG. 8 is a typical diagram of a mixer diode section employed in the diode mixer according to one embodiment of the present invention.

FIG. 8 is a typical diagram of a mixer diode section employed in the diode mixer according to one embodiment of the present invention.

In FIG. 8, an interdigital capacitor 48 is used as the capacitor 14a to constitute a first inductor circuit 14. In this case, a mixer diode section 16 can be configured even in the case of a diode 12 that needs a capacitor 14a having a low capacitance.

Figure 9:
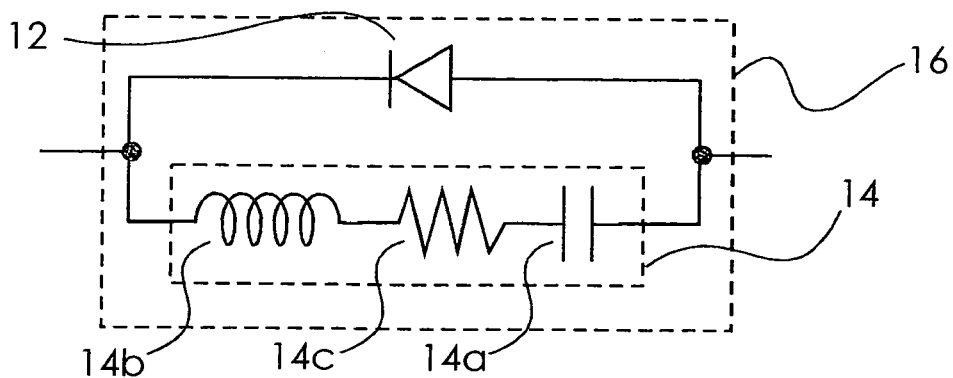
FIG. 9 is a typical diagram of a mixer diode section employed in the diode mixer according to one embodiment of the present invention.

FIG. 9 is a typical diagram of a mixer diode section employed in the diode mixer according to one embodiment of the present invention.

In FIG. 9, a first inductor circuit 14 is provided with a resistor 14c further series-connected to a circuit in which a capacitor 14a and an inductor 14b are connected in series. The resistor 14c is of a resistor having a resistance value larger than a variable resistive component 13 of a diode 12 connected in parallel with the first inductor circuit 14. It is thus possible to improve isolation between the anode and cathode of the diode 12.

Although the diode mixer 34 shown in FIG. 2 has been explained as the downconverter diode mixer, it can be constituted as a transmitting mixer used as an upconverter, wherein when an LO signal is inputted from an LO signal port 22 and an IF signal is inputted from an IF signal port 28 exactly in the same configuration, an RF signal is outputted from an RF signal port 32. Even in this case, the transmitting mixer brings about an advantageous effect similar to that of the downconverter receiving mixer.

Figure 10:
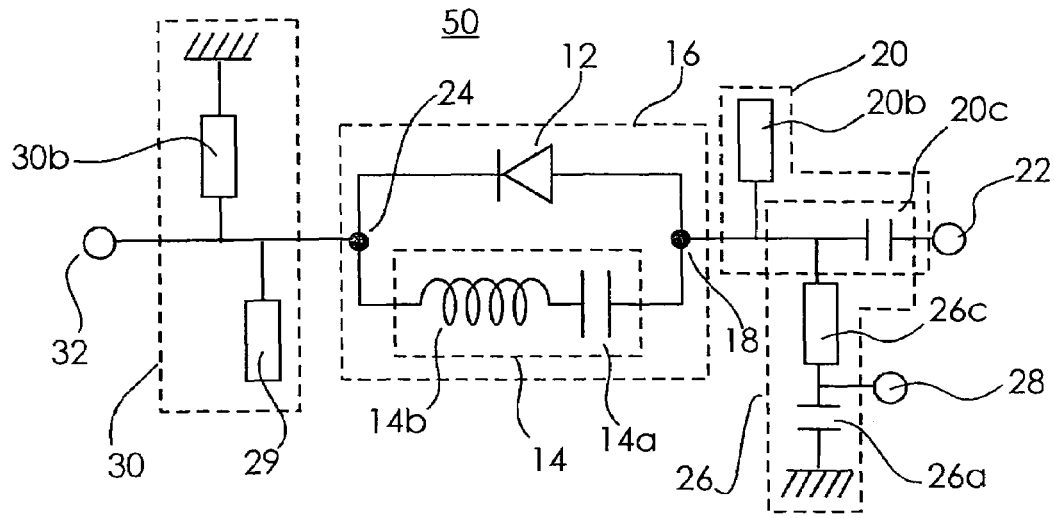
FIG. 10 is a circuit diagram of a diode mixer according to one embodiment of the present invention.

FIG. 10 is a circuit diagram of a diode mixer according to one embodiment of the present invention.

The diode mixer 50 shown in FIG. 10 is an example in which a second branching circuit 26 and an IF signal port 28 are connected to a first connecting portion 18 in place of the second connecting portion 24.

A first branching circuit 20 comprises an open stub 20b having an electric length of λRF/4 and a capacitor 20c both connected to the first connecting portion 18. The capacitor 20c is connected between the open stub 20b and an LO signal port 22.

The second branching circuit 26 comprises the capacitor 20c shared with the first branching circuit 20, and a short stub 26c having an electric length of λL0/4 and grounded via a DC cut off capacitor 26a.

A third branching circuit 30 comprises an open stub 29 having an electric length of λL0/4, which is connected to the second connecting portion 24, and a short stub 30b having an electric length of λRF/4, which is connected to the second connecting portion 24.

The open stub 20b function so as to allow an LO signal and an IF signal to pass therethrough and cut off an RF signal. The capacitor 20c reaches large impedance with respect to an IF signal low in frequency and causes the LO signal to pass through toward the LO signal port 22. Thus, the first branching circuit 20 allows the LO signal to pass through toward the LO signal port 22.

The open stub 20b functions so as to cause the Lb signal and the IF signal to pass therethrough and cut off the RF signal. The short stub 26c cuts off the LO signal with respect to the IF signal port 28 and causes the IF signal to pass therethrough. Thus, the second branching circuit 26 allows the IF signal to pass through toward the IF signal port 28.

The open stub 29 has the function of causing the RF signal and the IF signal to pass therethrough and cutting off the LO signal. The short stub 30b cuts off the IF signal with respect to an RF signal port 32 and causes the RF signal to pass therethrough. Thus, the third branching circuit 30 causes the RF signal to pass through toward the RF signal port 32.

In the diode mixer 50 configured in this way, a first inductor circuit 14 is connected in parallel with a diode 12 in a mixer diode section 16 in a manner similar to the diode mixer 34. The first inductor circuit 14 has a circuit in which a capacitor 14a and an inductor 14b are connected in series.

To this end, when the LO signal increased until its forward anode voltage amplitude reaches near a built-in voltage of the diode 12, is applied to the mixer diode section 16, parallel resonance occurs by means of the variable capacitive component 15 and the inductor 14b, so that leakage of input power with an increase in the capacitance of the variable capacitive component 15, which increases with an increase in anode voltage, is suppressed, and the LO signal is effectively inputted to its corresponding variable resistive component 13 of the diode 12 that contributes to frequency conversion at the diode mixer 50, thereby making it possible to improve frequency conversion gain of the diode mixer 50.

Thus, owing to the simple configuration that in a manner similar to the diode mixer 34, the first inductor circuit 14 having the circuit in which the capacitor 14a and the inductor 14b are connected in series, is connected in parallel with the diode 12 at the diode mixer 50, a diode mixer can be configured which is satisfactory in noise characteristic, large in conversion gain for frequency conversion and high in frequency conversion efficiency.

Figure 11:
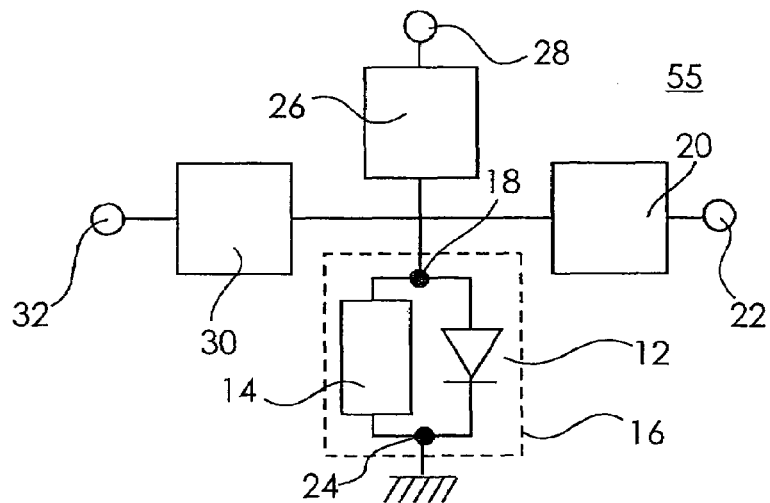
FIG. 11 is a block diagram of a diode mixer according to one embodiment of the present invention.

FIG. 11 is a block diagram of a diode mixer according to one embodiment of the present invention.

In the diode mixer 55 in FIG. 11, an LO signal port 22, an IF signal port 28, and an RF signal port 32 are respectively connected via a first branching circuit 20, a second branching circuit 26 and a third branching circuit 30 to a first connecting portion 18 to which the anode of a diode 12 and a first inductor circuit 14 in a mixer diode section 16 are connected. A second connecting portion 24 to which the cathode of the diode 12 and the first inductor circuit 14 in the mixer diode section 16 are connected, is grounded.

This configuration is also of a single-ended diode mixer. In a manner similar to the diode mixer 34, the first inductor circuit 14 is connected in parallel with the diode 12 in the mixer diode section 16. The first inductor circuit 14 has a circuit in which a capacitor 14a and an inductor 14b are connected in series.

To this end, when an LO signal increased until its forward anode voltage amplitude reaches near a built-in voltage of the diode 12, is applied to the mixer diode section 16, parallel resonance occurs by means of the variable capacitive component 15 and the inductor 14b. Hence leakage of input power with an increase in the capacitance of the variable capacitive component 15, which increases with an increase in anode voltage, is suppressed, and the LO signal is effectively inputted to its corresponding variable resistive component 13 of the diode 12 that contributes to frequency conversion at the diode mixer 55, thereby making it possible to improve frequency conversion gain of the diode mixer 55.

Thus, owing to the simple configuration that in a manner similar to the diode mixer 34, the first inductor circuit 14 having the circuit in which the capacitor 14a and the inductor 14b are connected in series, is connected in parallel with the diode 12 at the diode mixer 55, a diode mixer can be configured which is satisfactory in noise characteristic, large in conversion gain for frequency conversion and high in frequency conversion efficiency.

As described above, the diode mixer according to the present embodiment includes the mixer diode section 16 which makes use of the diode 12 good in noise characteristic and in which the first inductor circuit 14 having the circuit wherein the capacitor 14a and the inductor 14b are connected in series, is connected in parallel with the diode 12. The diode mixer is set in such a manner that the variable capacitive component 15 of the diode 12 at the time that it has the capacitance value corresponding to the anode voltage near the built-in voltage of the diode 12 and the inductor 14b, constitute the parallel resonant circuit with respect to the frequency of the LO signal.

To this end, the forward anode voltage amplitude of the LO signal applied to the diode 12 of the diode mixer is set to near the built-in voltage of the diode 12 high in frequency conversion gain, and the variable capacitive component 15 of the diode 12 and the inductor 14b resonate at the LO signal, so that leakage of the input power with the increase in the capacitance of the variable capacitive component 15 of the diode 12, which increases in the neighborhood of the built-in voltage thereof, is suppressed. It is therefore possible to obtain conversion gain high in frequency conversion.

Thus, the simple configuration that the first inductor circuit 14 having such a circuit that the capacitor 14a and the inductor 14b are connected in series, is connected in parallel with the diode 12, makes it possible to constitute a diode mixer satisfactory in noise characteristic, large in conversion gain for frequency conversion and high in frequency conversion efficiency.

Second Embodiment

Figure 12:
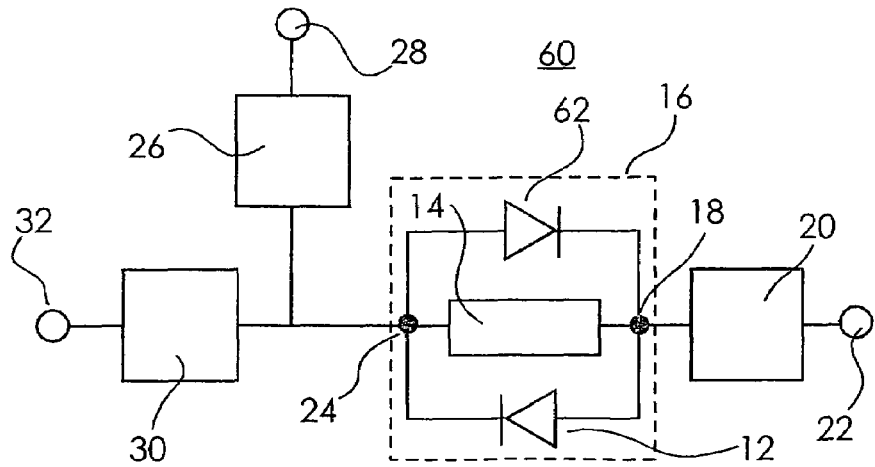
FIG. 12 is a block diagram of a diode mixer according to one embodiment of the present invention.

FIG. 12 is a block diagram of a diode mixer according to one embodiment of the present invention.

The diode mixer 60 is basically identical to the diode mixer 10 according to the first embodiment but different therefrom in that an antiparallel-connected diode 62 serving as a second diode is further added in addition to a diode 12 in a mixer diode section 16.

In FIG. 12, the diode 62 is connected in antiparallel with the diode 12. That is, the cathode of the diode 62 is connected to a first connecting portion 18, and the anode of the diode 62 is connected to a second connecting portion 24, respectively. Thus, a first inductor circuit 14 including an inductor and a capacitor connected in series is connected in parallel with the diode 12 and the diode 62 respectively.

Although there is shown an example in which a second branching circuit 26 and an IF signal port 28 are connected to the second connecting portion 24 in the diode mixer 60 in a manner similar to the diode mixer 10, the second branching circuit 26 and the IF signal port 28 may be connected to the first connecting portion 18 in place of the second connecting portion 24.

Figure 13:
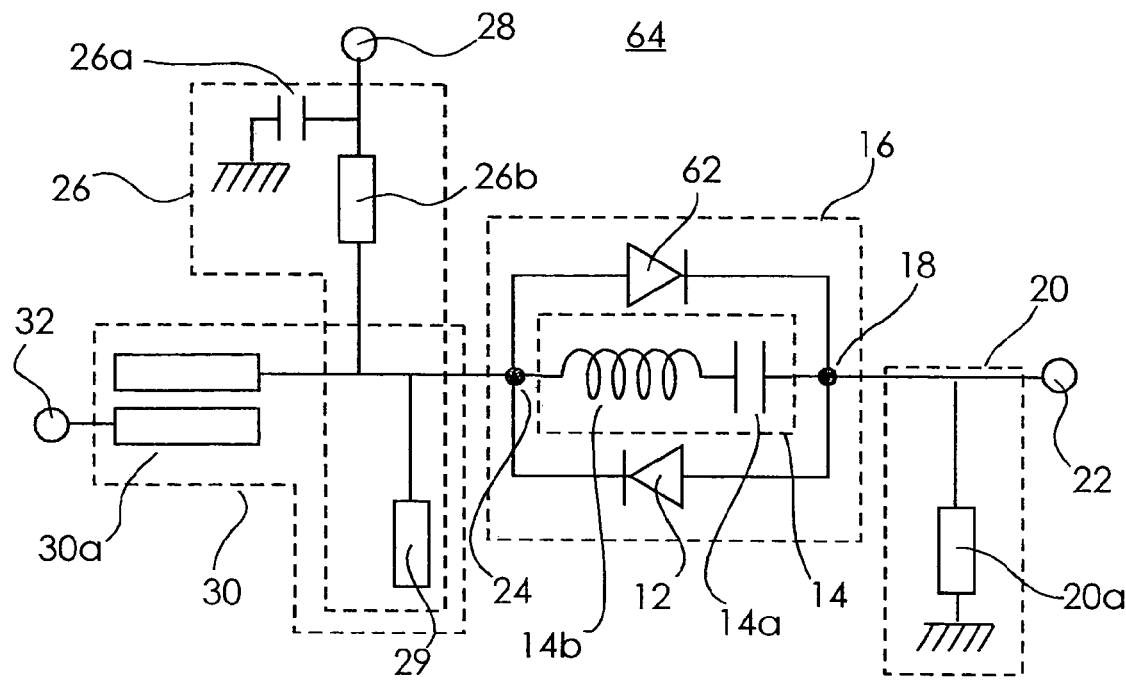
FIG. 13 is a circuit diagram of a diode mixer according to one embodiment of the present invention.

FIG. 13 is a circuit diagram of a diode mixer according to one embodiment of the present invention.

The diode mixer 64 shown in FIG. 13 is one example of the diode mixer 60, which is, for example, a downconverter even number harmonic mixer used as a receiving mixer of a 76 GHz-band vehicle-mounted millimeter wave radar used to detect obstacles or the like.

In the diode mixer 64, an LO signal of, for example, 38 GHz is inputted from an LO signal port 22, an RF signal of, for example, 76.0001 GHz is inputted from an RF signal port 32, and an IF signal having a low frequency, e.g., 100 kHz is outputted from an IF signal port 28.

A diode 12 of a mixer diode section 16 in the diode mixer 64 is a pn diode. In a manner similar to the diode mixer 34, a first inductor circuit 14 of the diode mixer 64 includes a DC cutoff capacitor 14a and an inductor 14b which produces resonance in parallel with a variable capacitive component of the diode 12 at the frequency of the LO signal to thereby suppress leakage of input power with an increase in the capacitive component.

A first branching circuit 20 comprises a short stub 20a having an electric length of λL0/4.

A second branching circuit 26 comprises an open stub 29 having an electric length of λL0/4, which is connected to a second connecting portion 24, and a short stub 26b which is connected to the second connecting portion 24 in like manner and has an electric length of λRF/4 and which is grounded via a DC cutoff capacitor 26a. Since λL0≅2λRF in the diode mixer 64, the open stub 29 is constituted as an open stub having an electric length of λL0/4 and an electric length of λRF/2.

A third branching circuit 30 comprises the open stub 29 shared with the second branching circuit 26, and a filter 30a constituted of a coupling or joining line having an electric length of λRF/4.

Thus, the first branching circuit 20 functions so as to cut off an RF signal and an IF signal with respect to the LO signal port 22 and cause the LO signal to pass through toward the LO signal port 22. The second branching circuit 26 cuts off the RF signal and the LO signal with respect to the IF signal port 28 and allows the IF signal to pass therethrough. The third branching circuit 30 cuts off the IF signal and the LO signal with respect to the RF signal port 32 and causes the RF signal to pass therethrough.

At the diode mixer 64, the LO signal (frequency fLO) is inputted from the LO signal port 22, the RF signal (frequency fRF) is inputted from the RF signal port 32, and power of the LO signal is increased to such a degree that the forward anode voltages of the diodes 12 and 62 reaches a built-in voltage (Va=near 1.2V) of the diode 12. The LO signal and the RF signal are mixed according to the nonlinearity of a current-voltage characteristic in the vicinity of the built-in voltage held by each of the diodes 12 and 62 to which the forward anode voltages are applied.

A signal having a desired frequency, which is taken from the mixed wave, is outputted from the IF signal port 28 through the second branching circuit 26 as an IF signal (frequency fIF). At this time, an IF signal at fIF=fRF−2fLO is taken out.

The voltage amplitude of the LO signal becomes near (Va=near 1.2V) the built-in voltage of each of the diodes 12 and 62, and conversion gain for frequency conversion is extremely large in a region in which current changes most abruptly with respect to the anode voltage of each of the diodes 12 and 62.

As described with reference to FIG. 4, however, the capacitance Cj of the variable capacitive component 15 of each of the diodes 12 and 62 steeply changes from 30 fF. up to 450 fF in the vicinity of the built-in voltage of each of the diodes 12 and 62 at the diode mixer 34 according to the first embodiment.

Therefore, in the case of the conventional diode mixer, the LO signal becomes hard to be inputted to its corresponding variable resistive component 13 of each of the diodes 12 and 62 with an increase in the capacitance Cj of the variable capacitive component 15 of each of the diodes 12 and 62, and hence a frequency conversion characteristic is degraded.

In the diode mixer 64, however, the first inductor circuit 14 is connected in parallel with the diodes 12 and 62 in the mixer diode section 16. The first inductor circuit 14 has a circuit in which the capacitor 14a and the inductor 14b are connected in series with each other.

And the amplitude of the forward anode voltage of the LO signal becomes a value near the built-in voltage of each of the diodes 12 and 62. Correspondingly, the variable capacitive component 15 of each of the diodes 12 and 62 has a large capacitance value. The inductance value of the inductor 14b is set in such a manner that the variable capacitive component 15 of the diode 12 having this large capacitance value and the inductor 14b, or the variable capacitive component 15 of the diode 62 having this large capacitance value and the inductor 14b constitute a parallel resonant circuit with respect to the frequency of the LO signal, in other words, a parallel resonant circuit is constituted of the variable capacitive component 15 of each of the diodes 12 and 62 and the inductor 14b.

To this end, when the LO signal whose power is increased to such an extent that the forward anode voltage amplitude of the LO signal reaches near the built-in voltage of each of the diodes 12 and 62, is applied to the mixer diode section 16, respective parallel resonance occur by means of the variable capacitive component 15 of the diode 12 and the inductor 14b, and the variable capacitive component 15 of the diode 62 and the inductor 14b respectively, so that leakage of input power with an increase in the capacitance of the variable capacitive component 15 of each of the diodes 12 and 62, which capacitance increases with an increase in the anode voltage, is suppressed, and the LO signal is effectively inputted to the variable resistive components 13 of the diodes 12 and 62 that contribute to frequency conversion at the diode mixer 64, thereby making it possible to improve frequency conversion gain of the diode mixer 64.

Figure 14:
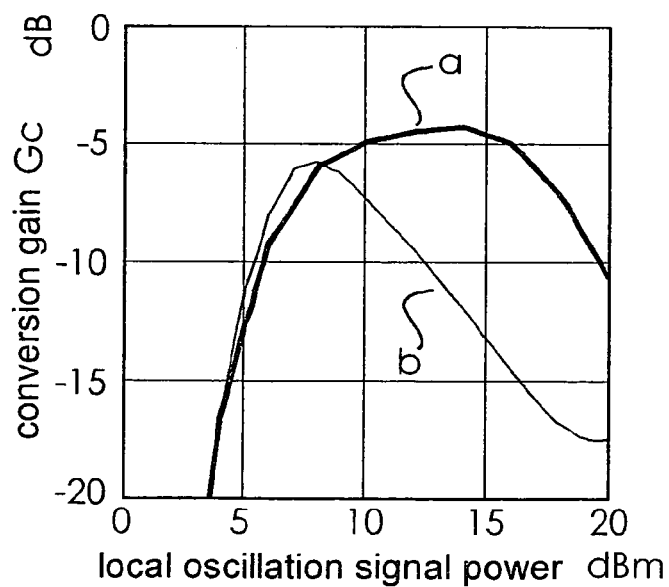
FIG. 14 is a graph showing the relationship between local oscillation signal power of the mixer diode section of the diode mixer according to one embodiment of the present invention and conversion gain.

FIG. 14 is a graph showing the relationship between local oscillation signal power of the mixer diode section of the diode mixer according to one embodiment of the present invention and conversion gain.

In FIG. 14, the unit of the vertical axis indicates dB, and the unit of the horizontal axis indicates dBm, respectively. However, dBm is expressed in decibel corresponding to the unit mW of power. 1 mW is 0 dBm and 1000 mW is 30 dBm.

A curve a shown in FIG. 14 indicates a relationship of conversion gain with respect to the local oscillation signal power of the mixer diode section 16, which is calculated where the inductor 14b is added to the mixer diode section having the antiparallel diode pair of the diode mixer 64.

For comparison, a calculated value obtained where the inductor 14b is omitted from the mixer diode section 16 is indicated by a curve b.

As is understood from FIG. 14, when no inductor 14b is inserted, the conversion gain Gc is reduced abruptly where the local oscillation signal power exceeds 8 dBm. However, when the inductor 14b is added to the mixer diode section 16, the conversion gain Gc can increase local oscillation signal power up to approximately 14 dBm while high conversion gain is being held, even when the local oscillation signal power exceeds 8 dBm.

Thus, the simple configuration that the first inductor circuit 14 having such a circuit that the capacitor 14a and the inductor 14b are connected in series, is connected in parallel with the diodes 12 and 62 respectively, makes it possible to constitute an even number harmonic diode mixer satisfactory in noise characteristic, large in conversion gain for frequency conversion and high in frequency conversion efficiency.

Incidentally, ones shown in FIGS. 5 through 9 of the first embodiment are applied as specific circuits each used as the first inductor circuit 14 of the diode mixer 64.

Figure 15:
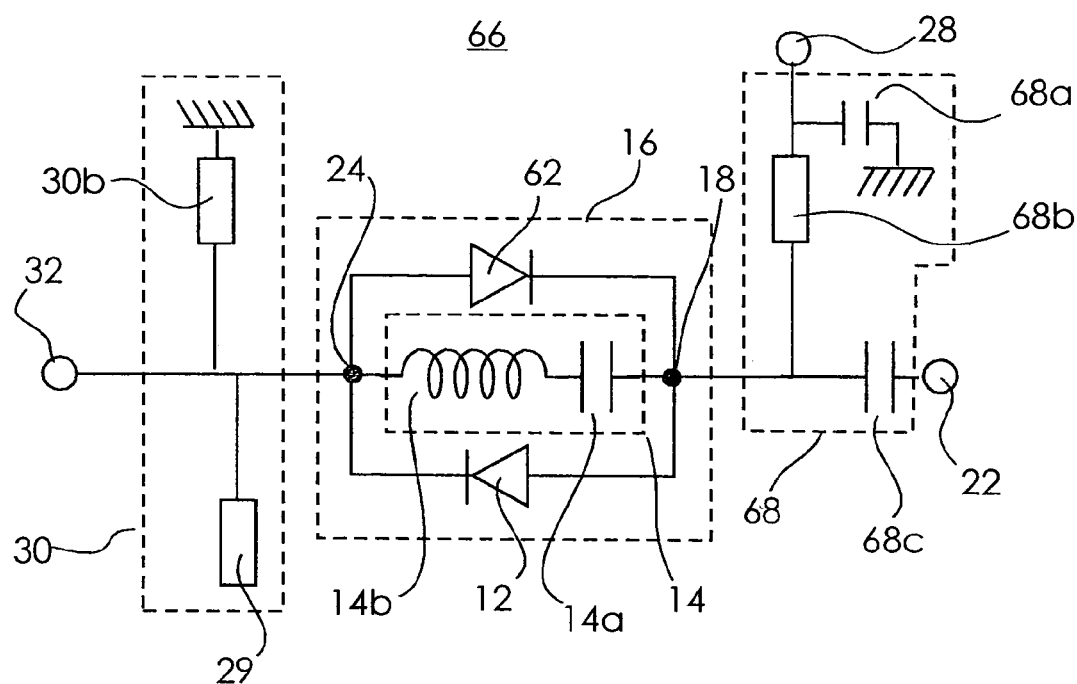
FIG. 15 is a circuit diagram of a diode mixer according to one embodiment of the present invention.

FIG. 15 is a circuit diagram of a diode mixer according to one embodiment of the present invention.

The diode mixer 66 shown in FIG. 15 corresponds to an example in which a second branching circuit 26 and an IF signal port 28 in FIG. 12 are connected to a first connecting portion 18 as an alternative to the second connecting portion 24.

In the diode mixer 66, a branching circuit 68 is configured as a type wherein the first branching circuit and the second branching circuit are held in common.

The branching circuit 68 comprises a short stub 68b having an electric length of λL0/4, whose one end is grounded via a capacitor 68a and whose other end is connected to the first connecting portion 18, and a capacitor 68c connected between the short stub 68b and the LO signal port 22.

Since the short stub 68b has the electric length of λL0/4, it has an electric length of λRF/2 with respect to an RF signal. Therefore, the RF signal is identical to be short-circuited at a short stub end of the short stub 68b. On the other hand, an LO signal is made open at the short stub end of the short stub 68b. Since the capacitor 68c is low in impedance at a high frequency like the LO signal, it can be inputted from the LO signal port 22.

The frequency of an IF signal is much lower than the frequencies of the LO signal and RF signal, and the IF signal is outputted to the IF signal port 28 to render the capacitor 68c large in impedance.

The third branching circuit 30 comprises an open stub 29 having an electric length of λL0/4 and a short stub 30b having an electric length of λRF/4 for DC ground.

At the diode mixer 66, the LO signal (frequency fLO) is inputted from the LO signal port 22, the RF signal (frequency fRF) is inputted from an RF signal port 32, and power of the LO signal is increased to such a degree that the forward anode voltages of the diodes 12 and 62 reaches a built-in voltage (Va=near 1.2V) of the diode 12. The LO signal and the RF signal are mixed according to the non-linearity of a current-voltage characteristic in the vicinity of the built-in voltage held by each of the diodes 12 and 62 to which the forward anode voltages are applied.

Even at the diode mixer 66, a first inductor circuit 14 is connected in parallel with the diodes 12 and 62 respectively, in the mixer diode section 16. The first inductor circuit 14 has a circuit in which a capacitor 14a and an inductor 14b are connected in series.

Thus, the diode mixer 66 has the same operation and effect as the diode mixer 64. With the simple configuration that the first inductor circuit 14 having the circuit in which the capacitor 14a and the inductor 14b are connected in series, is connected in parallel with the diodes 12 and 62 respectively, an even number harmonic diode mixer can be constructed which is good in noise characteristic, large in conversion gain for frequency conversion and high in frequency conversion efficiency.

As described above, the even number harmonic diode mixer according to the present embodiment includes the mixer diode section 16 which makes use of the diodes 12 and 62 good in noise characteristic and in which the first inductor circuit 14 having the circuit wherein the capacitor 14a and the inductor 14b are connected in series, is connected in parallel with the diodes 12 and 62 respectively. Further, the diode mixer is set in such a manner that the variable capacitive component 15 of the diode 12 and the inductor 14b at the time that it has a capacitance value corresponding to the anode voltage near the built-in voltage of each of the diodes 12 and 62, and the variable capacitive component 15 of the diode 62 and the inductor 14b at the time thereof respectively constitute parallel resonant circuits with respect to the frequency of the LO signal.

To this end, the forward anode voltage amplitude of the LO signal applied to each of the diodes 12 and 62 of the diode mixer is set to near the built-in voltage of each of the diodes 12 and 62 each high in frequency conversion gain, and the variable capacitive component 15 of the diode 12 and the inductor 14b, and the variable capacitive component 15 of the diode 62 and the inductor 14b respectively resonate at the LO signal, so that leakage of the input power with the increase in the capacitance of the variable capacitive component 15 of each of the diodes 12 and 62, which capacitance increases in the neighborhood of the built-in voltage thereof, is suppressed. It is therefore possible to obtain conversion gain high in frequency conversion.

Thus, the simple configuration that the first inductor circuit 14 having such a circuit that the capacitor 14a and the inductor 14b are connected in series, is connected in parallel with the diodes 12 and 62 respectively, makes it possible to constitute a diode mixer satisfactory in noise characteristic, large in conversion gain for frequency conversion and high in frequency conversion efficiency.

Third Embodiment

Figure 16:
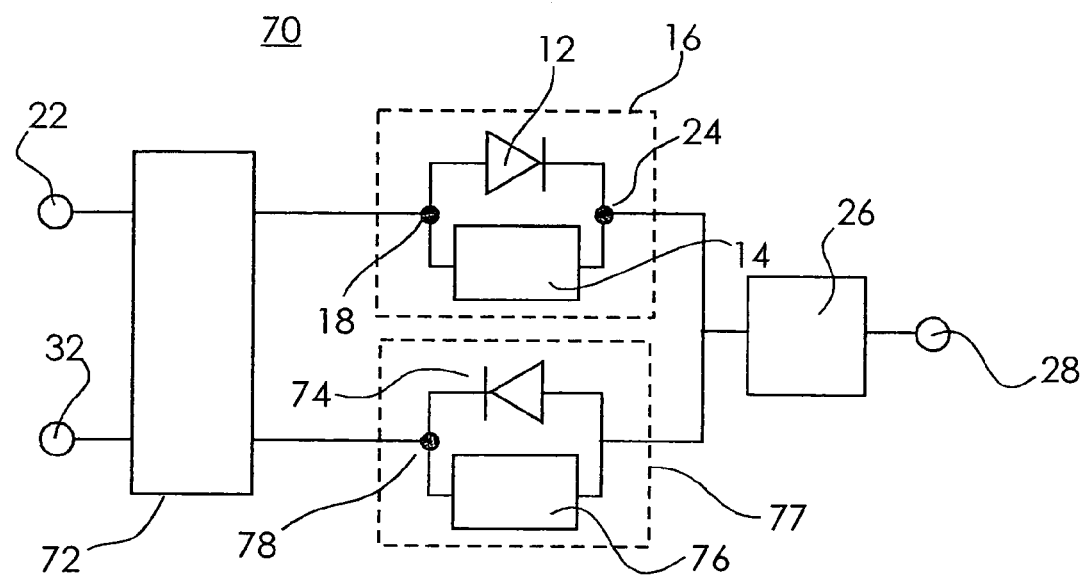
FIG. 16 is a block diagram of a diode mixer according to one embodiment of the present invention.

FIG. 16 is a block diagram of a diode mixer according to one embodiment of the present invention.

The diode mixer 70 shown in FIG. 16 is of a balance type diode mixer and further includes, in addition to a first mixer diode section 16, a second mixer diode section 77 including a diode 74 serving as a second diode, which is connected in antiparallel with a diode 12 of the first mixer diode section 16, and a second inductor circuit 76 serving as a second circuit element unit, which is connected in parallel with the diode 74.

The anode of the diode 74 of the second mixer diode section 77 and one end of the second inductor circuit 76 are connected to a second connecting portion 24 of the first mixer diode section 16, whereas the cathode of the diode 74 and the other end of the second inductor circuit 76 are connected to a third connecting portion 78.

And a first connecting portion 18 and the third connecting portion 78 are connected to an LO signal port 22 and an RF signal port 32 through a branching circuit 72 in which a first branching circuit and a third branching circuit are formed integrally.

On the other hand, the second connecting portion 24 is connected to an IF signal port 28 through a second distribution circuit 26.

The second inductor circuit 76 has an inductor and a capacitor connected in series in a manner similar to a first inductor circuit 14.

Figure 17:
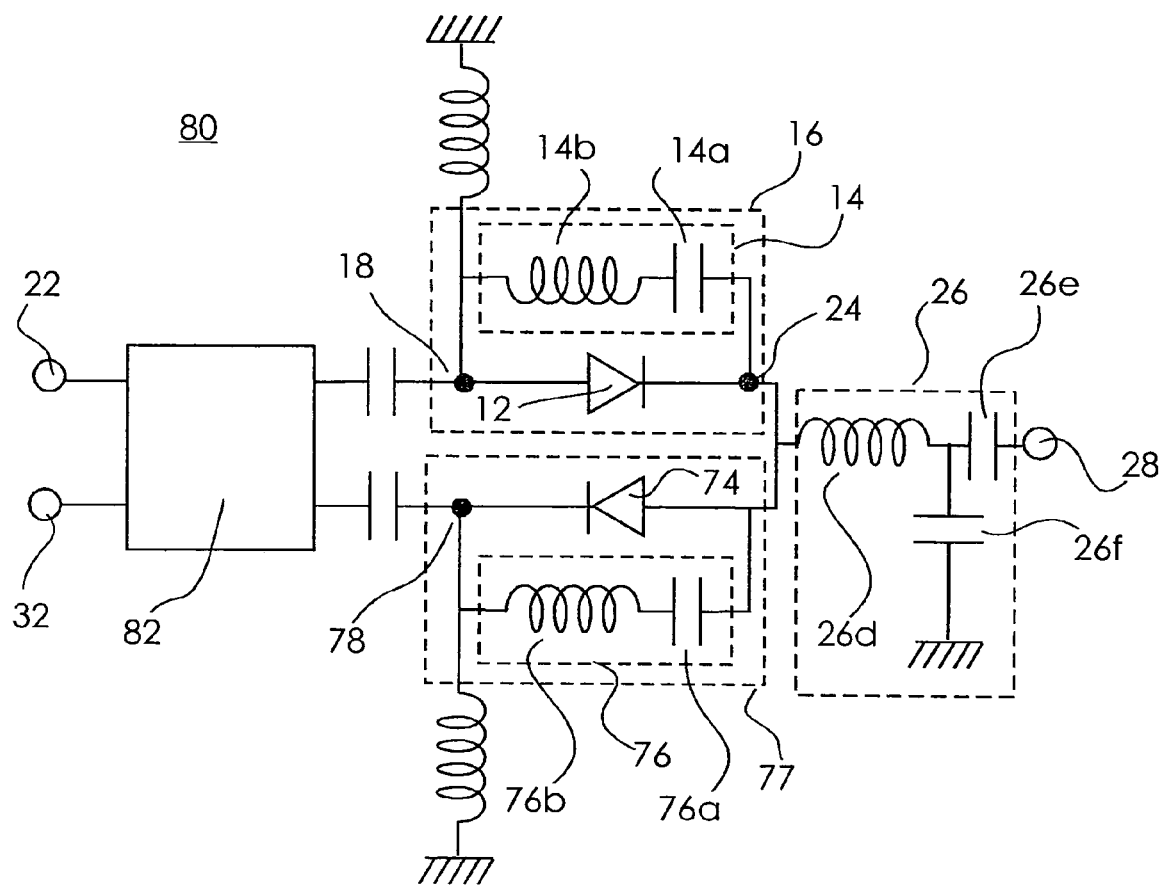
FIG. 17 is a circuit diagram of a diode mixer according to one embodiment of the present invention.

FIG. 17 is a circuit diagram of a diode mixer according to one embodiment of the present invention.

The diode mixer 80 shown in the circuit diagram of FIG. 17 is one example of the diode mixer 70. In the diode mixer 80, a Lange coupler 82 is used as the branching circuit 72. The second branching circuit 26 includes an inductor 26d and a capacitor 26e series-connected between a second connecting portion 24 and an IF signal port 28, and a capacitor 26f shunt-connected between a connecting point of the inductor 26d and the capacitor 26e and a ground terminal.

In a manner similar to the first inductor circuit 14 even at the diode mixer 80, a second inductor circuit 76 includes a capacitor 76a for DC cutoff, and an inductor 76b which produces resonance in parallel with a variable capacitive component of a diode 74 at the frequency of an LO signal to thereby suppress leakage of input power with an increase in capacitive component.

The inductance value of the inductor 76b is set in such a manner that the amplitude of a voltage applied to the anode of the diode 74, based on the LO signal becomes a value near a built-in voltage of the diode 74 and correspondingly the variable capacitive component of the diode 74 constitutes a parallel resonant circuit together with a capacitance having a large value.

Thus, when the LO signal whose power is increased to such an extent that the forward anode voltage amplitude of the LO signal reaches near the built-in voltage of each of a diode 12 and the diode 74, is applied to a mixer diode section 16 and a second mixer diode section 77 in a manner similar to the diode mixer 34 according to the first embodiment, respective parallel resonance occur by means of a variable capacitive component 15 of the diode 12 and an inductor 14b, and the variable capacitive component 15 of the diode 74 and the inductor 76b respectively, so that leakage of input power with an increase in the capacitance of the variable capacitive component 15 of each of the diodes 12 and 74, which capacitance increases with an increase in the anode voltage, is suppressed, and the LO signal is effectively inputted to variable resistive components 13 of the diodes 12 and 74 that contribute to frequency conversion at the diode mixer 80, thereby making it possible to improve frequency conversion gain of the diode mixer 80.

In the diode mixer 80 in this way, the simple configuration that the first inductor circuit 14 having such a circuit that the capacitor 14a and the inductor 14b are connected in series, is connected in parallel with the diode 12, and the second inductor circuit 76 having such a circuit that the capacitor 76a and the inductor 76b are connected in series, is connected in parallel with the diode 74, respectively, makes it possible to constitute a diode mixer satisfactory in noise characteristic, large in conversion gain for frequency conversion and high in frequency conversion efficiency.

Incidentally, a circuit in which a capacitor for DC cut off, and an inductor which produces resonance in parallel with a variable capacitance component of a diode at the frequency of an LO signal to suppress an increase in capacitive component are connected in series, is connected in parallel with the diode of the diode mixer, whereby a diode mixer satisfactory in noise characteristic, large in conversion gain for frequency conversion and high in frequency conversion efficiency is configured. This configuration brings about similar effects even at diode mixers having other configurations without being limited to the diode mixers described in the above embodiments.

Although the pn diodes have been explained as the diodes in the above embodiments, various Schottky diodes also bring about similar advantageous effects.

As described above, diode mixers according to the present invention are suitable for use in electronic equipment for a vehicle-mounted millimeter wave radar or the like, microwave-band and millimeter-wave band communication apparatuses for mobile communications, wireless communications or the like, etc.

While the presently preferred embodiments of the present invention have been shown and described. It is to be understood these disclosures are for the purpose of illustration and that various changes and modifications may be made without departing from the scope of the invention as set forth in the appended claims.

What is claimed is:
1. A diode mixer comprising:
    a semiconductor section having a first circuit element unit including an inductor and a capacitor connected in series, a first diode having an anode and a cathode and connected in parallel with the first circuit element unit, a first connecting portion to which a first end of the first circuit element unit and the anode of the first diode are connected, and a second connecting portion to which a second end of the first circuit element unit and the cathode of the first diode are connected;
    a first signal input/output terminal coupled to the first connecting portion of the semiconductor section and receiving a first signal;
    a first branching circuit disposed between the first signal input/output terminal and the first connecting portion of the semiconductor section;
    second and third branching circuits:
    a second signal input/output terminal coupled to the semiconductor section through the second branching circuit; and
    a third signal input/output terminal coupled to the semiconductor section through the third branching circuit, wherein the inductor and a capacitive component of the first diode constitute a resonant circuit with respect to the first signal.

2. The diode mixer according to claim 1, further comprising a second diode having a cathode connected to the first connecting portion and an anode connected to the second connecting portion of the semiconductor section, wherein the capacitive component of the first diode or a capacitive component of the second diode and the inductor constitute a resonant circuit with respect to the first signal.

3. The diode mixer according to claim 1, wherein the second signal input/output terminal is coupled to the first connecting portion of the semiconductor section, the third signal input/output terminal is coupled to the first connecting portion of the semiconductor section, and the second connecting portion of the semiconductor section is grounded.

4. The diode mixer according to claim 2, wherein the second signal input/output terminal is coupled to the first connecting portion of the semiconductor section, the third signal input/output terminal is coupled to the first connecting portion of the semiconductor section, and the second connecting portion of the semiconductor section is grounded.

5. The diode mixer according to claim 1, wherein the second signal input/output terminal is coupled to the first connecting portion of the semiconductor section, and the third signal input/output terminal is coupled to the second connecting portion of the semiconductor section.

6. The diode mixer according to claim 2, wherein the second signal input/output terminal is coupled to the first connecting portion of the semiconductor section, and the third signal input/output terminal is coupled to the second connecting portion of the semiconductor section.

7. The diode mixer according to claim 1, wherein the second signal input/output terminal is coupled to the second connecting portion of the semiconductor section, and the third signal input/output terminal is coupled to the second connecting portion of the semiconductor section.

8. The diode mixer according to claim 2, wherein the second signal input/output terminal is coupled to the second connecting portion of the semiconductor section, and the third signal input/output terminal is coupled to the second connecting portion of the semiconductor section.

9. The diode mixer according to claim 1, further comprising, in the semiconductor section, a second circuit element unit including an inductor and a capacitor connected in series, a second diode having an anode and a cathode and connected in parallel with the second circuit element unit, a first end of the second circuit element unit and the anode of the second diode being connected to the second connecting portion, and a third connecting portion to which a second end of the second circuit element unit and the cathode of the second diode are connected, wherein the inductor of the second circuit element unit and a capacitive component of the second diode constitute a resonant circuit with respect to the first signal, and the first and third connecting portions are both coupled to corresponding first and third signal input/output terminals through first and third integral branching circuits, and the second connecting portion is coupled to a second signal input/output terminal.

10. The diode mixer according to claim 1, further comprising, in the first circuit element unit of the semiconductor section, a resistor having a resistance larger than a resistive component of the first diode, and connected in series with the inductor and capacitor of the first circuit element unit.

11. The diode mixer according to claim 2, further comprising, in the first circuit element unit of the semiconductor section, a resistor having a resistance larger than a resistive component of the first or second diode, and connected in series with the inductor and capacitor of the first circuit element units.

12. The diode mixer according to claim 9, further comprising, in each of the first and second circuit element units of the semiconductor section, a resistor having a resistance value larger than a resistive component of the first or second diode, and connected in series with the inductor and capacitor of one of the first and second circuit element units.

* * * * *